(12) United States Patent
Schuurmans

(10) Patent No.: US 7,079,061 B2
(45) Date of Patent: Jul. 18, 2006

(54) SIGMA DELTA AND CONVERTER WITH PSEUDO FLASH CONVERTER

(75) Inventor: Han Martijn Schuurmans, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/515,959

(22) PCT Filed: May 13, 2003

(86) PCT No.: PCT/IB03/02008

§ 371 (c)(1),
(2), (4) Date: Nov. 23, 2004

(87) PCT Pub. No.: WO03/100984

PCT Pub. Date: Dec. 4, 2003

(65) Prior Publication Data

US 2006/0033649 A1    Feb. 16, 2006

(30) Foreign Application Priority Data

May 29, 2003   (EP) ................................. 02077109

(51) Int. Cl.
*H03M 3/00*   (2006.01)
(52) U.S. Cl. ........................ 341/143; 341/155; 341/159
(58) Field of Classification Search ................ 341/143, 341/155, 158–159
See application file for complete search history.

(56) References Cited

U.S. PATENT DOCUMENTS

| 6,229,469 B1 * | 5/2001 | Gaudet ........................ 341/143 |
| 6,292,121 B1 * | 9/2001 | Cake et al. ................. 341/143 |
| 6,346,898 B1 * | 2/2002 | Melanson ................... 341/143 |
| 6,396,428 B1 * | 5/2002 | Cheng ......................... 341/143 |
| 6,404,372 B1 * | 6/2002 | Heithoff ...................... 341/155 |
| 6,492,929 B1 * | 12/2002 | Coffey et al. .............. 341/155 |
| 2002/0186776 A1 | 12/2002 | Cosand |

OTHER PUBLICATIONS

Azeredo Leme C et al: "Oversampled Interface for IC Sensors" Instrumentation and Measurement Technology Conference, 1994. IMTC/97 Conference Proceedings. pp. 652-655.

* cited by examiner

*Primary Examiner*—Rexford Barnie
*Assistant Examiner*—Khai Nguyen
(74) *Attorney, Agent, or Firm*—Michael J. Ure

(57) ABSTRACT

The invention relates to a Sigma Delta A/D converter (2) for generating a N-bits digital output signal (4) on the basis of an analogue input signal (6), comprising a control loop which comprises a quantizer (8) comprising at least a comparator (24.1, 24.2) for generating the N-bits digital output signal (4) and a D/A converter (10) in a first feedback loop (12) of the control loop for generating an analogue version (14) of the N-bits digital output signal (4) on the basis of the N-bits digital output signal (4), wherein the quantizer (8) also comprises an Up-Down counter (26) which is coupled to the comparator (24.1, 24.2), wherein the D/A converter (10) is coupled to the comparator (24.1, 24.2) in a second feedback loop (27) of the control loop.

4 Claims, 1 Drawing Sheet

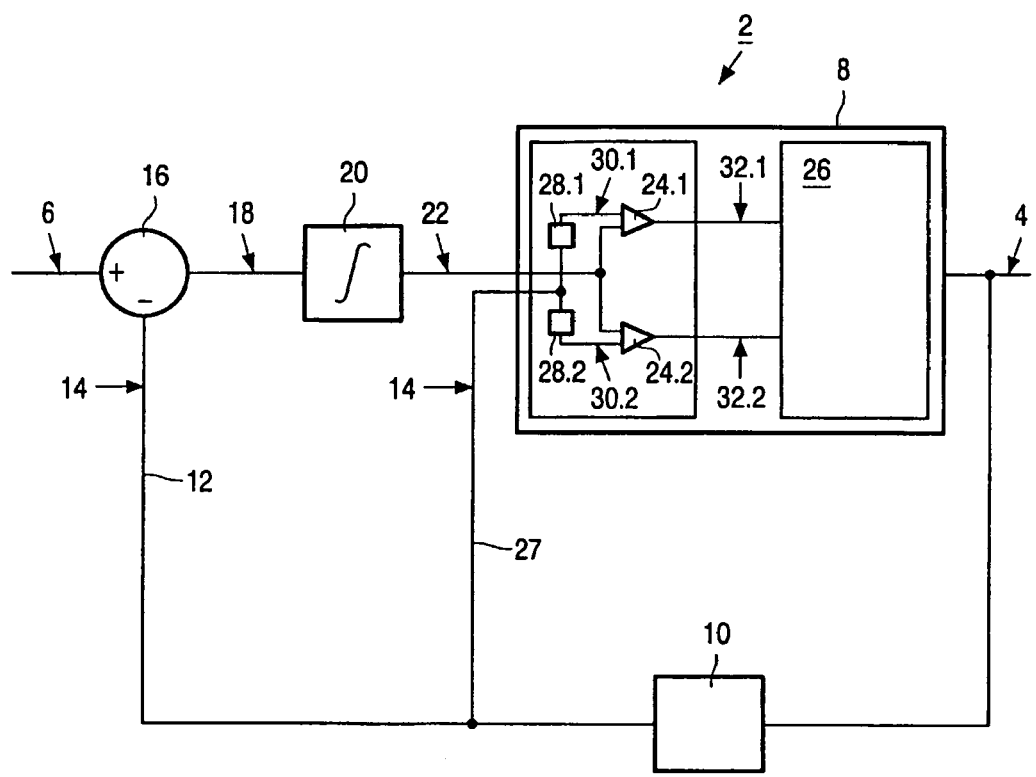

SIGMA DELTA AND CONVERTER WITH PSEUDO FLASH CONVERTER

FIELD OF THE INVENTION

The invention relates to a Sigma Delta A/D converter for generating a N-bits digital output signal on the basis of an analogue input signal, comprising a control loop which comprises a quantizer comprising at least a comparator for generating the N-bits digital output signal and a D/A converter in a first feedback loop of the control loop for generating an analogue version of the N-bits digital output signal on the basis of the N-bits digital output signal.

DESCRIPTION OF THE RELATED ART

The said Sigma Delta A/D converter is known in actual practice. A particular example of the known Sigma Delta A/D converter can be found in U.S. Pat. No. 5,982,313.

Sigma Delta A/D converters have come into wide spread use. With relative simple circuitry Sigma Delta A/D converters can achieve a relatively high accuracy. A simple circuitry can be achieved if the said quantizer is a 1-bit A/D converter. An advantage of the 1-bit A/D converter is that it has a perfect linearity. A disadvantage of the 1-bit A/D converter is that it generates large quantization errors. In principle, these large quantization errors result in a poor accuracy of the Sigma Delta A/D converter. However, according to Sigma Delta technology, an oversampling is applied (sampling rate greater than the Nyquist rate). As a consequence of this a large part of the quantization noise is shifted outside the signal bandwidth. This is called noise-shaping which allows subsequent filtering of the noise. In this way a relatively high accuracy and a relatively high Signal-to-Noise ratio can be achieved.

In order to further increase the Signal to Noise Ratio of the Sigma Delta A/D converter the loopfilter order and/or the oversampling ratio can be increased. Furthermore it is possible to increase the number of quantification levels which yields a multi-bit Sigma Delta A/D converter.

Increasing the number of quantization levels may be achieved by applying a quantizer comprising a multi-bit comparator, preferably a multi-bit flash comparator. An advantage of a flash comparator is that it adds a negligible delay in the control loop. However, a disadvantage of a N-bits flash comparator is that it requires many 1-bit comparators (for example [M−1] comparators for M different signal levels of an N-bits flash comparator, wherein $M=2^N$ for M, N integers). Therefore, the flash comparator makes the Sigma Delta converter sizeable, expensive and the circuitry of the Sigma Delta complex.

SUMMARY OF THE INVENTION

It is an object of the invention to provide a multi-bit Sigma Delta A/D converter which is relatively compact and simple and which has a relative high signal bandwidth and a high SNR. For this, the invention provides a Sigma Delta A/D converter which is characterised in that the quantizer also comprises an Up-Down counter which is coupled to the comparator, wherein the D/A converter is coupled to the comparator in a second feedback loop of the control loop. The D/A converter is part of the first feedback loop of the control loop and is also part of the second feedback loop. The second feedback loop is a direct loop from the Up-Down counter to the comparator. As a consequence of the direct feedback of the second feedback loop, the combination of the comparator and the Up-Down counter acts as a flash comparator. The number of comparators in the Sigma Delta converter according to the invention is independent of the number of signal levels of the quantizer and generally much less than the number of comparators in the known Sigma Delta converter. Thus, according to the invention an effective, simple and compact multi-bit Sigma Delta A/D converter is achieved.

An embodiment of the Sigma Delta converter according to the invention is characterised in that the Sigma Delta A/D converter also comprises a combiner for generating a combined signal by combining the analogue input signal with the analogue version of the N-bits digital output signal, and a loopfilter for generating a filtered combined signal by filtering the combined signal, wherein the comparator is arranged for generating a control signal on the basis of the filtered combined signal and the analogue version of the N-bits digital output signal, and wherein the Up-Down counter is arranged for generating the N-bits digital output signal on the basis of the control signal. If the filtered combined signal is significantly greater (smaller) that the analogue version of the N-bits digital output signal then the control signal will control the Up-Down counter in such a way that it counts up (count down) with one unit for the next sample period. In this way the N-bits digital output signal can be increased or decreased for the subsequent sample period with one unit with respect to the current sample period.

A preferred embodiment according to the invention is characterised in that the quantizer comprises two comparators which are coupled to the Up-Down counter. With the first comparator it is checked whether the filtered combined signal is greater than the analogue version of the N-bits digital output signal plus a first pre-determined threshold value. This results in a first control signal. With the second comparator it is checked whether the filtered combined signal is less than the analogue version of the N-bits digital output signal minus a second pre-determined threshold value. This results in a second control signal. The first and second control signals are fed to the Up-Down counter. If the filtered combined signal is greater (smaller) than the analogue version of the N-bits digital output signal plus (minus) the threshold value then the Up-Down counter counts up (down) with one unit for the next sample period. If the filtered combined signal lies within the interval determined by the first and second threshold values then the Up-Down counter keeps its value for the next sample period.

Preferably, the loopfilter of the Sigma Delta converter is a cascade of integrators depending on the order of the loopfilter for obtaining a rapid response of the Sigma Delta A/D converter to fluctuations of the analogue input signal.

In the accompanying drawing, in which a preferred embodiment of the Sigma Delta converter according to the present invention is shown for illustrative purposes:

BRIEF DESCRIPTION OF THE DRAWING

The sole figure is a schematic overview of an embodiment of the Sigma Delta A/D converter according to the invention.

DETAILED DESCRIPTION OF THE DRAWINGS

In the figure a schematic overview of a Sigma Delta A/D converter 2 according to the invention is shown. The Sigma Delta A/D converter 2 can generate a N-bits digital output signal 4 on the basis of an analogue input signal 6. The Sigma Delta A/D converter 2 comprises a control loop with a multi-bit quantizer 8 for generating the N-bits digital output signal 4. Furthermore, the control loop comprises a D/A converter 10 in a first feedback loop 12 for generating an analogue version 14 of the N-bits digital output signal on the basis of the N-bits digital output signal 4.

The Sigma Delta A/D converter 2 also comprises a combiner 16 for generating a combined signal 18 by combining the analogue input signal 6 with the analogue version 14 of the N-bits digital output signal. Furthermore, the Sigma Delta A/D converter 2 comprises a loopfilter 20 for generating a filtered combined signal 22 by filtering the combined signal 18. In this example the loopfilter 20 is an integrator.

The quantizer 8 comprises two comparators 24.1, 24.2 and an Up-Down counter 26. The combination of the two comparators 24.1, 24.2 and the Up-Down counter 26 acts as a flash converter and can be called a pseudo multi-bit flash comparator. The operation of the combination of the comparators 24.1, 24.2 and the Up-Down counter 26 will be discussed in more detail hereinafter.

The Sigma Delta A/D converter 2 comprises a second feedback loop 27. The analogue version 14 of the N-bits digital output signal can be fed to the quantizer 8 via the second feedback loop 27. The time constant of the second feedback loop 27 is negligible to the time constant of the first feedback loop 12. Therefore, the quantizer 8 can dispose over the analogue version 14 of the N-bits digital output signal in a relative short time after the N-bits digital output signal 4 has been output of the Sigma Delta A/D converter 2. This is an important aspect of the Sigma Delta A/D converter 2 since it enables the quantizer 8 to operate as a multi-bit flash converter while only two comparators 24.1 and 24.2 are used.

In the quantizer 8 the analogue version 14 is fed to a first threshold setting block 28.1 and to a second threshold setting block 28.2 via the second feedback loop 27. The first threshold setting block 28.1 adds a positive predetermined first threshold value to the analogue version 14 of the N-bits digital output signal for generating a first reference signal 30.1. Subsequently, the first reference signal 30.1 is fed to the first comparator 24.1. The second threshold setting block 28.2 subtracts a positive predetermined second threshold value for generating a second reference signal 30.2. The second reference signal 30.2 is fed to the second comparator 24.2.

The first comparator 24.1 generates a first control signal 32.1 on the basis of the filtered combined signal 22 and the first reference signal 30.1. If the filtered combined signal 22 is greater than the first reference signal 30.1 then the first control signal 32.1 is set to logic value 1 by the first comparator 24.1. If the filtered combined signal 22 is less than the first reference signal 30.1 then the first control signal 32.1 is set to logic value 0. In an analogous way the second comparator 24.2 generates a second control signal 32.2 on the basis of the filtered combined signal 22 and the second reference signal 30.2. If the filtered combined signal 22 is greater than the second reference signal 30.2 then the second control signal 32.2 is set to logic value 1 by the second comparator 24.2. If the filtered combined signal 22 is less than the second reference signal 30.2 then the second control signal 32.2 is set to logic value 0.

The comparators 24.1, 24.2 are connected with the Up-Down counter 26 such that the first and second control signals 32.1, 32.2 can be fed to the Up-Down counter 26. If the first and second control signal 32.1, 32.2 are both equal to logic value 1 then the Up-Down counter 26 counts up with one unit. Consequently, the N-bits digital output signal 4 is increased with one unit. If the first and second control signal 32.1, 32.2 are both equal to logic value 0 then the Up-Down counter 26 counts down with one unit, such that the N-bits digital output signal 4 is decreased with one unit. If the first control signal 32.1 is equal to logic value 0 and the second control signal 32.2 is equal to logic value 1 then the Up-Down counter 26 maintains it value, such that the N-bits digital output signal is unchanged.

The Sigma Delta A/D converter 2 is connected to a system clock which is not depicted in the drawing for reasons of simplicity. The system clock is responsible for the timing of for example the comparators 24.1, 24.2, the Up-Down counter 26 and the D/A converter 10. Generally, the sample period of the system clock is chosen small enough to enable the Sigma Delta A/D converter 2 to follow rapid signal fluctuations of the analogue input signal 6. Each sample period the respective comparators 24.1, 24.2 generate the respective control signals 32.1, 32.1 which are subsequently fed to the Up-Down counter 26, and each sample period the Up-Down counter 26 can change one unit such that the N-bits digital output signal 4 is changed with one unit. In this way the Up-Down counter 26 can count up an down in a pre-determined interval. This pre-determined interval is the range of the N-bits digital output signal 4. Often, the interval of the Up-Down counter 26 is related to the number of bits N of the N-bits digital output signal 4.

The invention has been described according to a preferred embodiment. However, it should be noted that the invention can be practised otherwise than as specifically illustrated and described without departing from its spirit or scope. It is noted that in alternative embodiments of the Sigma Delta A/D converter according to the invention the multi-bit quantizer can also be provided with only one, three or more comparators.

The invention claimed is:

1. A Sigma Delta A/D converter for generating a N-bits digital output signal on the basis of an analogue input signal, comprising a control loop which comprises a quantizer comprising at least a comparator for generating the N-bits digital output signal and a D/A converter in a first feedback loop of the control loop for generating an analogue version of the N-bits digital output signal on the basis of the N-bits digital output signal, and a combiner for generating a combined signal by combining the analogue input signal with the analogue version of the N-bits digital output signal wherein, the quantizer also comprises an Up-Down counter which is coupled to the comparator, wherein the D/A converter is coupled to the comparator in a second feedback loop of the control loop.

2. A Sigma Delta A/D converter according to claim 1, wherein the Sigma Delta A/D converter also comprises a loopfilter for generating a filtered combined signal by filtering the combined signal, wherein the comparator is arranged for generating a control signal on the basis of the filtered combined signal and the analogue version of the N-bits digital output signal, and wherein the Up-Down counter is arranged for generating the N-bits digital output signal on the basis of the control signal.

3. A Sigma Delta A/D converter according to claim 2, wherein the loopfilter is an integrator.

4. A Sigma Delta A/D converter according to claim 1, wherein the quantizer comprises two comparators which are coupled to the Up-Down counter.

* * * * *